United States Patent [19]

Cole

[11] Patent Number: 5,437,736
[45] Date of Patent: Aug. 1, 1995

[54] SEMICONDUCTOR FIBER SOLAR CELLS AND MODULES

[76] Inventor: Eric D. Cole, 14076 Winding Ridge La., Centreville, Va. 22020

[21] Appl. No.: 196,382

[22] Filed: Feb. 15, 1994

[51] Int. Cl.6 .................. H01L 31/06; H01L 31/042; H01L 31/048; H01L 31/05; H01L 31/052
[52] U.S. Cl. ..................... 136/259; 136/244; 136/246; 136/251; 136/255; 136/256
[58] Field of Search ............. 136/244, 246, 250–251, 136/255, 256, 259; 437/2–5, 205, 209, 215–216, 219, 225; 427/74–76; 257/465–466

[56] References Cited

U.S. PATENT DOCUMENTS

| | | | |
|---|---|---|---|
| Re. 29,833 | 11/1978 | Mlavsky | 136/246 |
| 3,134,906 | 5/1964 | Henker | 136/246 |
| 3,591,348 | 7/1971 | Belle | 117/23 |
| 3,687,633 | 8/1972 | Belle et al. | 117/209 |
| 3,984,256 | 10/1976 | Fletcher et al. | 136/244 |
| 3,990,914 | 11/1976 | Weinstein et al. | 136/246 |
| 4,056,404 | 11/1977 | Garone et al. | 136/255 |
| 4,143,234 | 3/1979 | Johnson et al. | 136/259 |
| 4,152,536 | 5/1979 | Ravi | 136/255 |
| 4,193,744 | 4/1990 | Hoegl et al. | 136/244 |
| 5,240,510 | 8/1993 | Goldade et al. | 136/259 |

FOREIGN PATENT DOCUMENTS

| | | | |
|---|---|---|---|
| 2327643 | 5/1977 | France | 136/246 |
| 59-125670 | 7/1984 | Japan | 136/255 |
| 60-42876 | 3/1985 | Japan | 136/244 |
| WO84/04425 | 11/1984 | WIPO | 136/244 |

Primary Examiner—Aaron Weisstuch
Attorney, Agent, or Firm—Fisher & Associates

[57] ABSTRACT

A semiconductor solar cell formed on a optical fiber or fibers, including layers of semiconductor materials surrounding an annular extent of each fiber. The cell is embedded into a superstrate which is a collimating lens. A method of manufacturing the cell and module are disclosed.

18 Claims, 9 Drawing Sheets

SEMICONDUCTOR FIBER SOLAR CELLS AND MODULES

CROSS-REFERENCE TO RELATED DOCUMENTS

This application addresses the subject matter of Disclosure Document Number 308147, which was filed with the U.S. Patent and Trademark Office on Jun. 3, 1992.

BACKGROUND OF THE INVENTION

1. Field of the Invention

The present invention relates generally to solar cells, and more particularly to thin film solar cells constructed of semiconductor material formed substantially about a fiber and incorporated into a module.

2. Description of the Prior Art

Solar cells have been fabricated in fiber forms and planar forms. The following are examples of such devices. U.S. Pat. No. 3,984,256, invented by Fletcher et al., discloses forming a cell array constructed of silicon fibers, each being doped to produce an inner region of one polarity type and an outer region of an opposite polarity type to form a continuous radial semiconductor junction. These fibers are arranged in both parallel and serial arrangements. The fiber is made of semiconductor material used as the base of the solar cell. Re. 29,833 discloses a tubular structure and is directed to providing conductive paths between interconnected fibers or tubes. Further examples of such tube-like structures are disclosed in U.S. Pat. Nos. 3,134,906, 3,687,633 and 3,591,348.

U.S. Pat. No. 3,990,914, invented by Weinstein et al., discloses forming a photovoltaic cell disposed on the inner and outer surfaces of a glass tube. The cell is formed of $Cu_2S$ and CdS which provide a heterojunction. The semiconductor material is disposed around the circumference of the glass tube.

U.S. Pat. No. 4,056,404, invented by Garone et al., discloses a method and structure for providing an oval solar cell.

U.S. Pat. No. 4,152,536, invented by Ravi, discloses forming a monocrystalline silicon ribbon according to the process disclosed in U.S. Pat. No. 3,591,348. The ribbon is formed by a hollow tube along the length of the tube. This provides a slightly curved photovoltaic cell.

U.S. Pat. No. 4,143,234, invented by Johnson et al., discloses a monocrystalline element formed as a half cylindrical junction. A collector is formed atop the arcuate cell.

U.S. Pat. No. 5,240,510, invented by Goldade et al., discloses a planar cell provided with a hemispherical portion for directing radiant energy to the cell.

U.S. Pat. No. 4,913,744, invented by Hoegl et al., discloses forming a layered cylindrical photovoltaic cell arrangement. The cell is formed by layering multiple cylindrical cells disposed on a planar substrate.

The above referenced patents require expensive and time consuming processes and produce less than optimal performance cells with increased resistance.

SUMMARY OF THE INVENTION

It is therefore an object of the present invention to provide a semiconductor solar cell with reduced material usage, increased efficiency, ease of manufacturing and reduce construction cost.

It is a further object to provide a semiconductor solar cell having increased efficiency by reducing dark or shaded areas and by providing a concentrator.

It is yet another object to provide a semiconductor solar cell and module with reduced resistance losses based on the geometry of the device.

It is yet another object to provide a semiconductor solar cell that reduces grid obscuration loss through wrapped contacts.

It is yet another object to provide a semiconductor solar cell that is simple to integrate into either series or parallel modules.

It is yet another object to provide a semiconductor solar cell that is simpler to fabricate.

It is yet another object to provide a solar cell and module with increased concentration, light weight and radiation hardness.

In all of the above embodiments, it is an object to provide an inexpensive solar cell and module.

Finally, it is an object of the invention to provide a more efficient solar cell.

According to one broad aspect of the present invention, there is provided a generic semiconductor solar cell and module. The solar cell comprises: a substrate coated with at least two semiconductive layers, the substrate having at least two conductive connections; a first conductive connection between the first semiconductive layer and the substrate; and a second conductive connection disposed on the second semiconductive layer. The semiconductive layers are selectively disposed about the substrate.

Other objects and features of the present invention will be apparent from the following detailed description of the preferred embodiment.

BRIEF DESCRIPTION OF THE DRAWINGS

The invention will be further described in conjunction with the accompanying drawings, in which.

DETAILED DESCRIPTION OF THE PREFERRED EMBODIMENT

Figure 1:
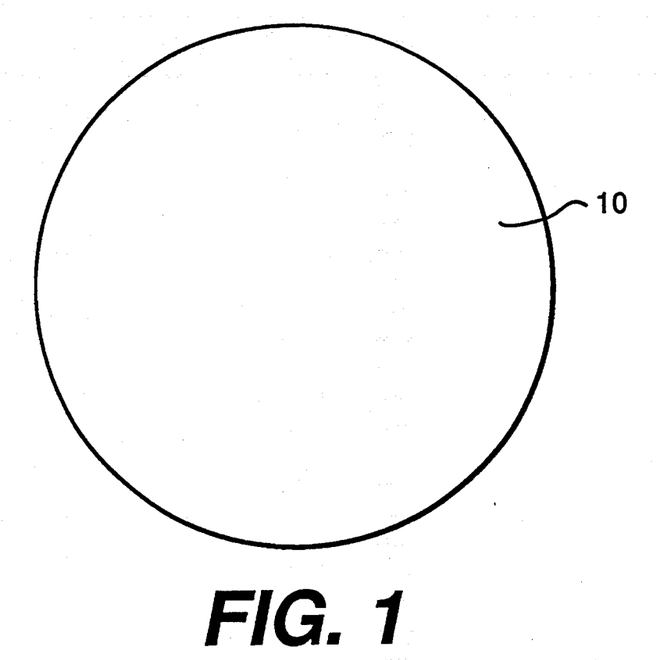
FIG. 1 is a cross section of the substrate fiber constructed in accordance with a preferred embodiment of the invention.
Figure 2:
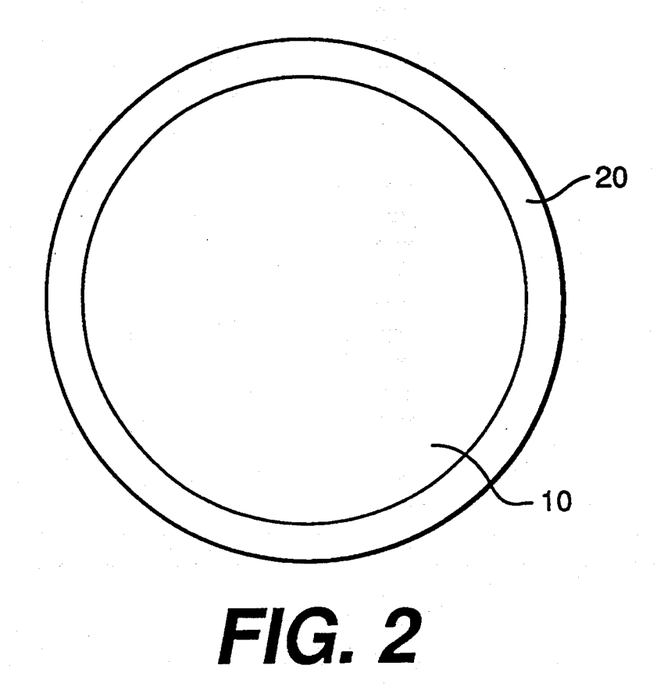
FIG. 2 is a cross section of the substrate with a coating of molybdenum.

With reference to the Figures, wherein like reference characters indicate like elements throughout the several views and, in particular, with reference to FIG. 1, a rod or fiber substrate 10 is shown. Substrate 10 is made of glass. The types of glass may include fused quartz, borosilicate or soda-lime. As shown in FIG. 2, the substrate 10 is sputter coated with a conductive layer such as molybdenum 20. It should be appreciated, however, that any well known method of coating substrate 10 may be utilized.

Figure 3:
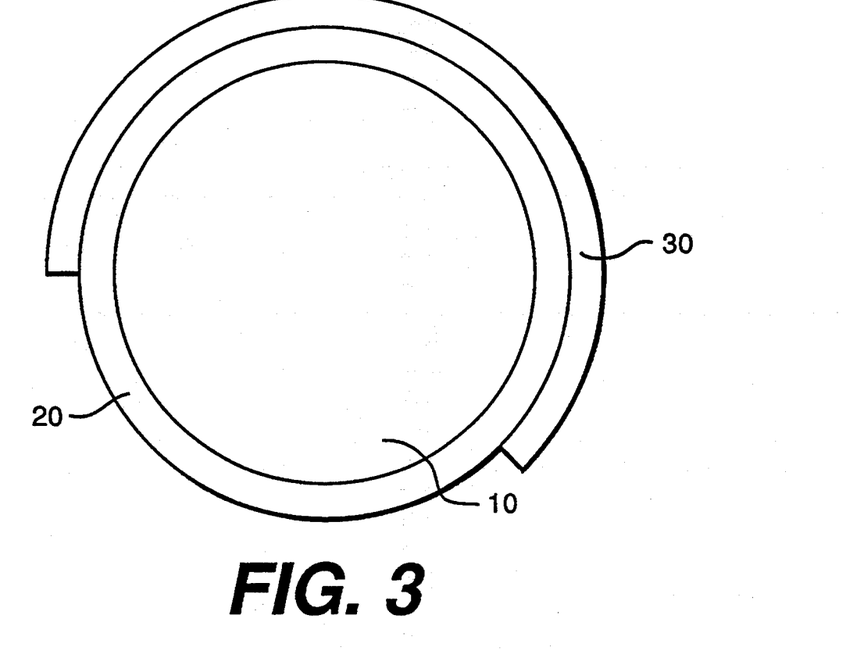
FIG. 3 is a cross section of the substrate with a coating of semiconductive material on the molybdenum layer.
Figure 4:
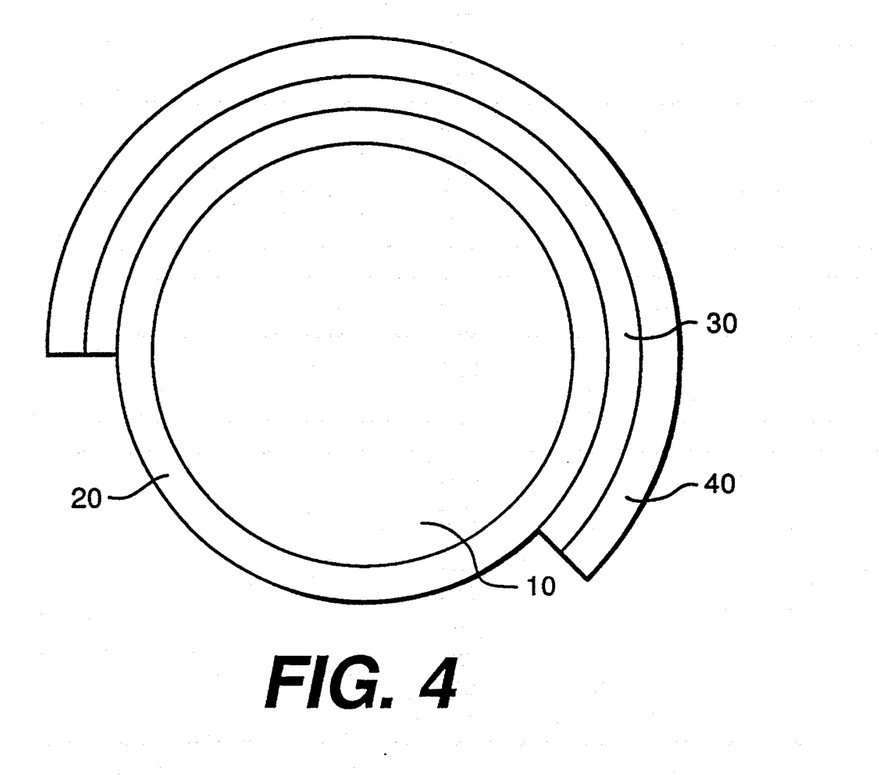
FIG. 4 is a cross section of the substrate with a coating of a second semiconductive material on the first semiconductor material layer.

A first coating of semiconductor material 30 is then applied onto the molybdenum 20, shown in FIG. 3. The material 30 is applied to cover a portion of the substrate 10. A second coating of semiconductor material 40 is then applied onto first semiconductor material 30, as shown in FIG. 4. Semiconductor materials 30 and 40 are oppositely doped. That is one is N type and the other is P type. Though, as is known, one could as easily be P++ and the other N−−. Further, CIGS and CdS may be used.

Figure 5:
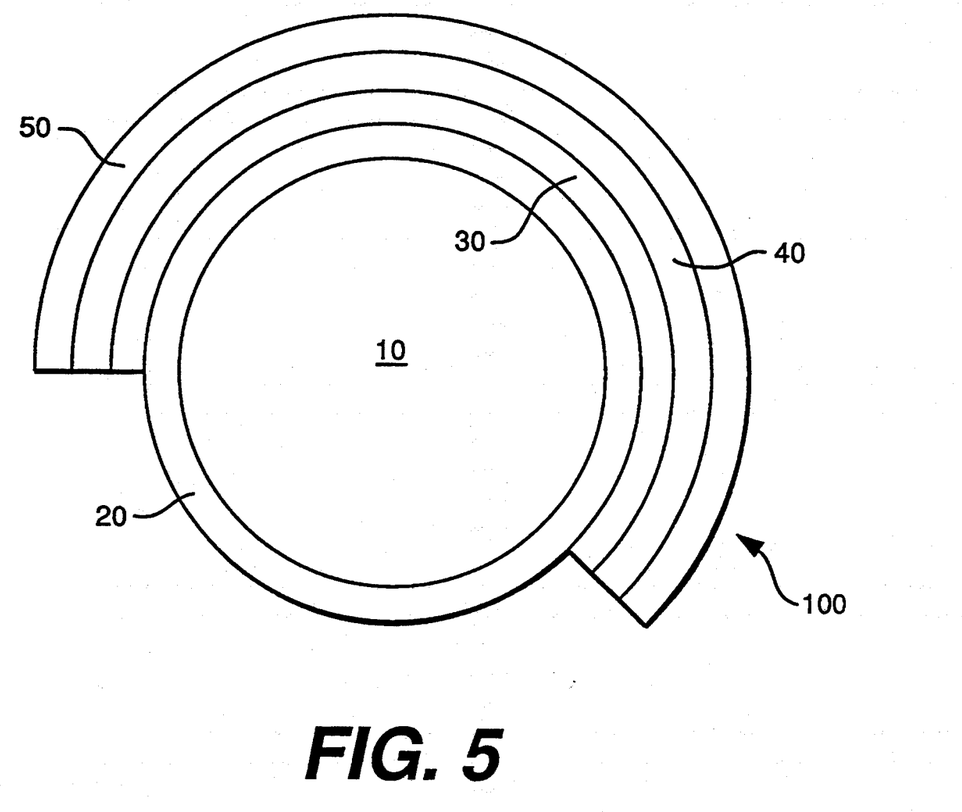
FIG. 5 is a cross section of a semiconductor solar cell which is constructed in accordance with a preferred embodiment of the invention.
Figure 6:
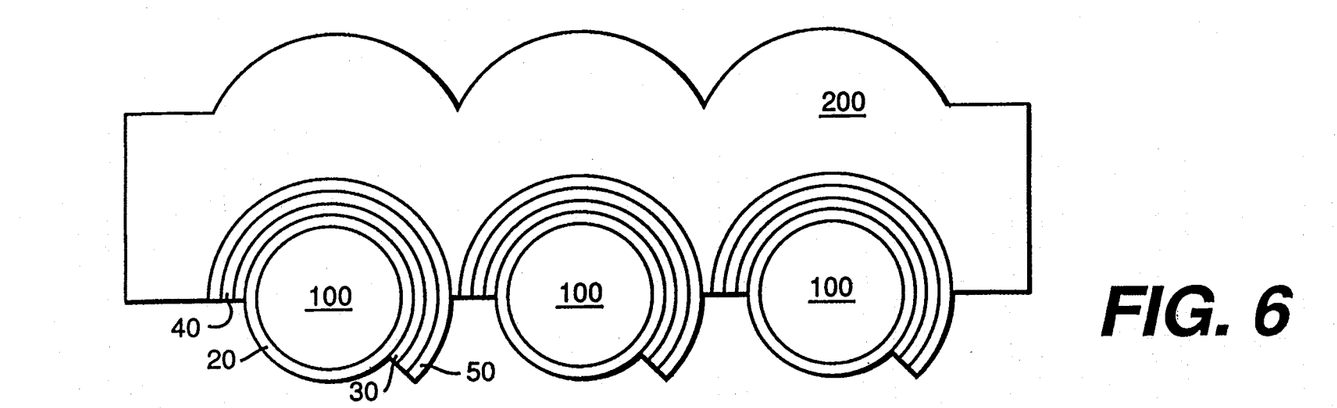
FIG. 6 is a cross section of the semiconductor solar cell embedded in an acrylic material forming a lens and support system.

FIG. 5 shows a second conductive layer of material 50, e.g. ZnO, applied onto layer 40. Layers 20 and 50 provide electrical contact to the semiconductor junction formed by layers 30 and 4! 3. This construction forms a basic cell 100. In practice, cells 100 are formed on a spool and heat pressed into an acrylic lens superstrate 200, as shown in FIG. 6. Acrylic lens superstrate 200 is used to focus light to a high degree. Manufacture of the superstrate 200 may be carded out in a number of ways, including, injection molding stamping, extrusion, or any other method known in the fabricating art.

Figure 7:
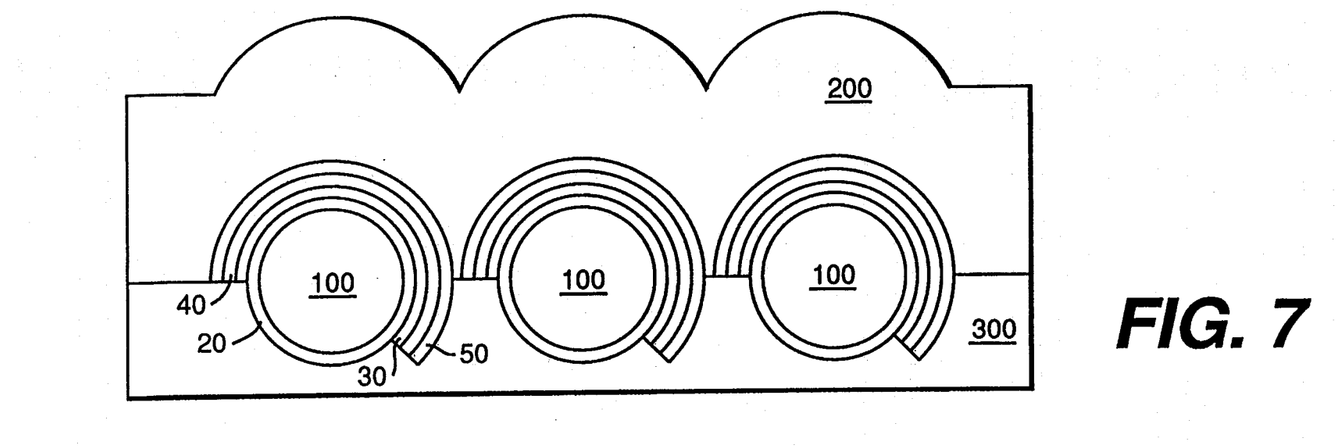
FIG. 7 is a cross section of the cell and lens with a metallization layer forming a module which is constructed in accordance with a preferred embodiment of the invention.
Figures 8, 9:
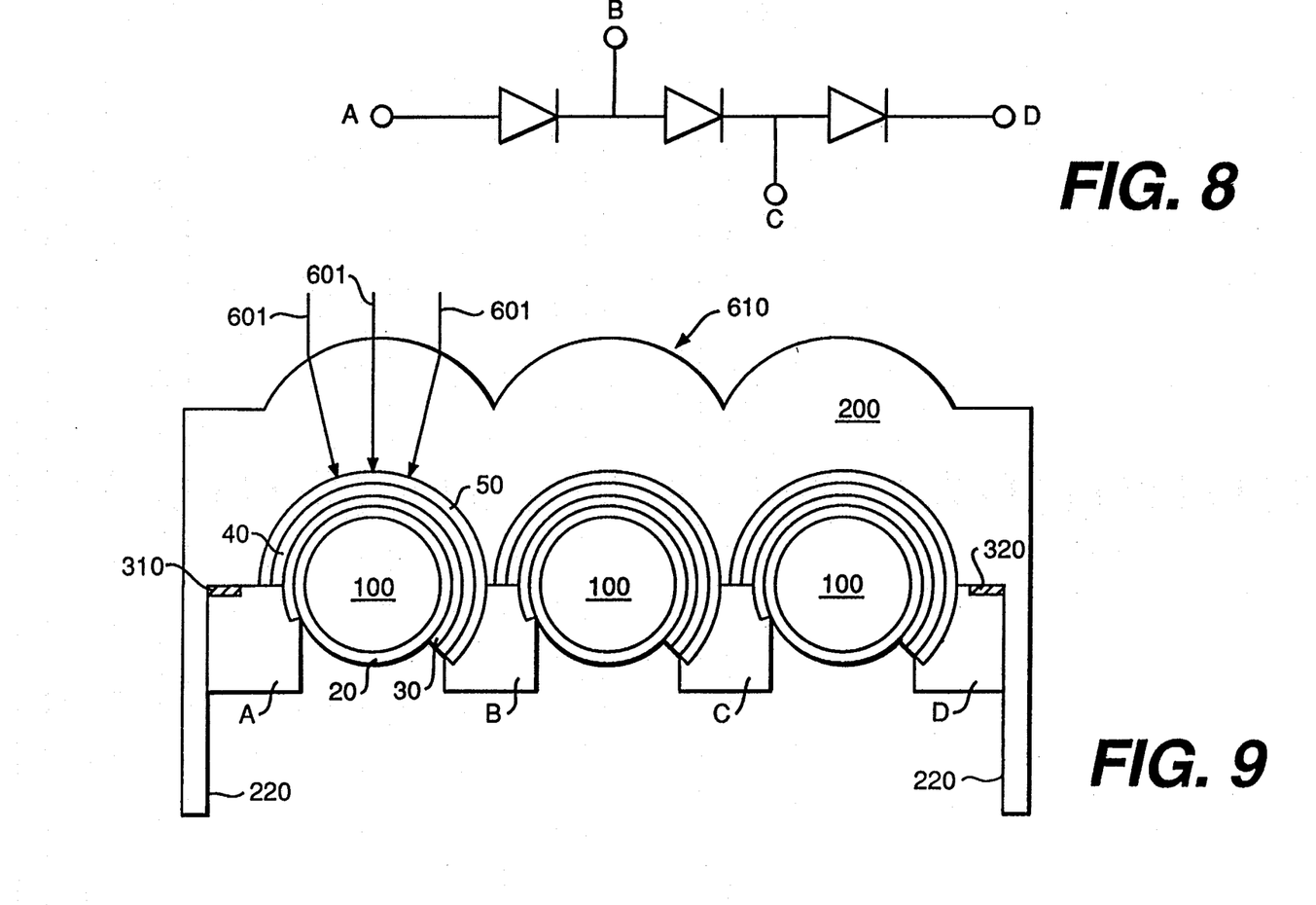
FIG. 8 is a schematic of a circuit having diodes which are connected in series.
FIG. 9 is a cross section of the semiconductor solar cell with selectively removed metalization areas to provide an equivalent circuit as shown in FIG. 8.
Figure 10:
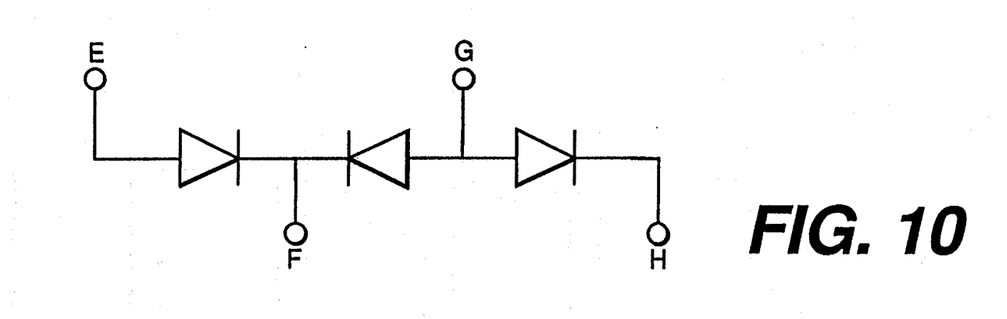
FIG. 10 is a schematic of a circuit having diodes connected in parallel.
Figure 11:
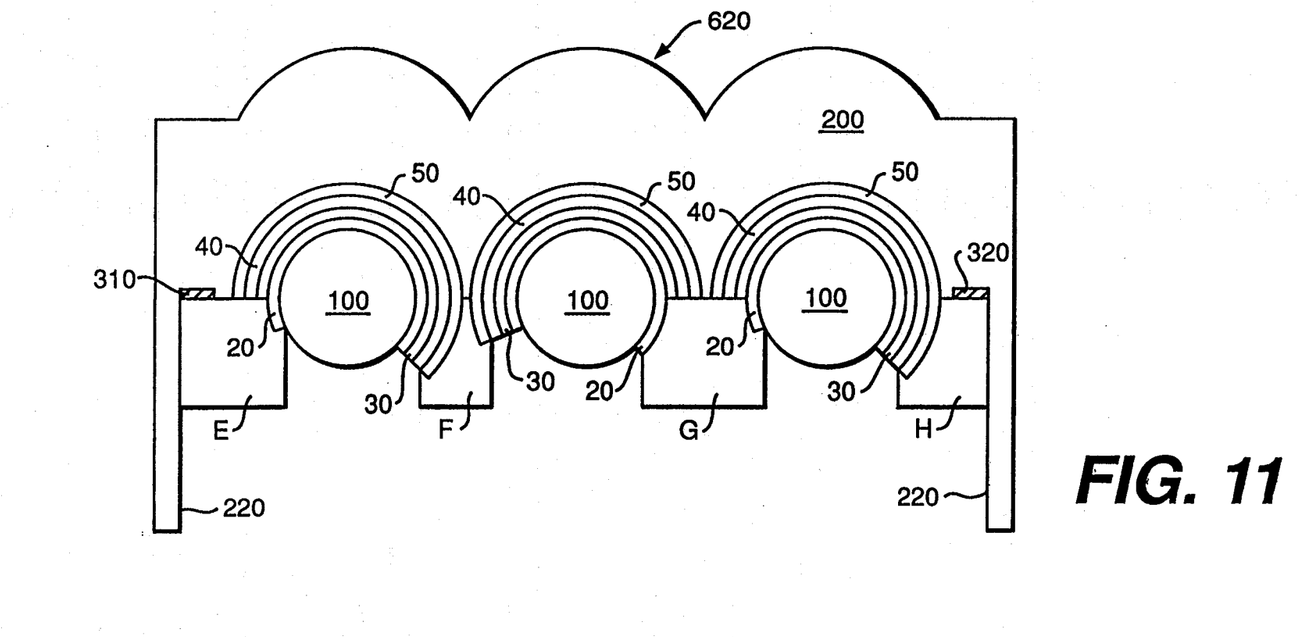
FIG. 11 is a cross section of the semiconductor solar cell with selectively removed metalization areas to provide an equivalent circuit as shown in FIG. 10.
Figure 13:
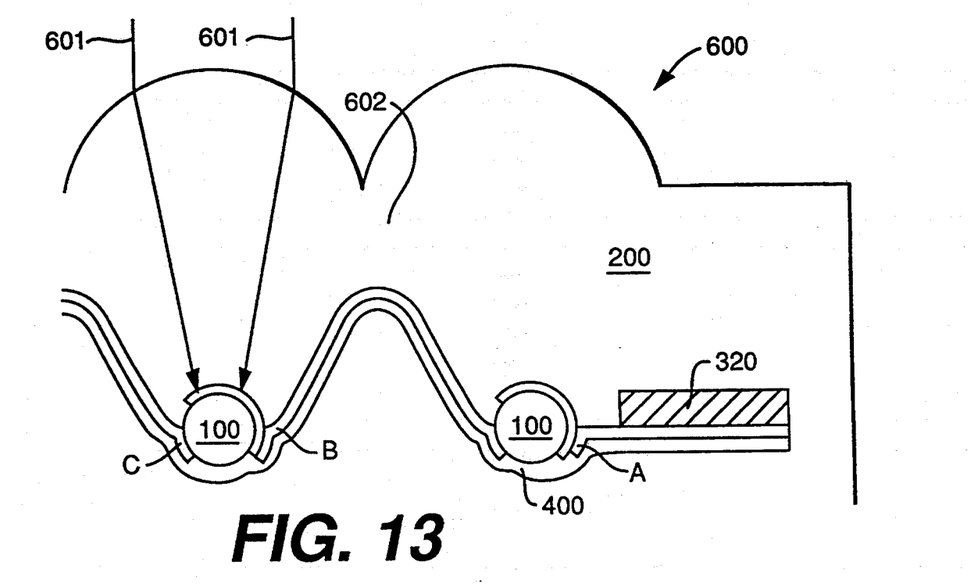
FIG. 13 is a cross section of the solar cell module showing notched areas and an edge bus strip.

Referring to FIG. 7, a plurality of cells 100 affixed to superstrate 200 and having a metallization coating 300 applied thereto are illustrated. Coating 300 is selectively removed to provide either serial or parallel connections between cells. FIG. 8 is a schematic of an equivalent diode model of the serial module 610 illustrated in FIG. 9. As may be seen in FIG. 9, module 610 has a selectively removed metallization layer 300 and superstrate side supports 220. The remaining interconnections labeled A, B, C and D provide connections between cells 100 and bus strips 3 10 and 320. Bus strips 310 and 320 and metalization layer 300 may be metals such as Al, Cu, Ni, or any other conducting material and are applied by known techniques such as evaporating, sputtering, or electroplating. A plastic coating 400 is shown in FIG. 13 as covering the interconnections A, B, C and D. This layer is provided for environmental protection. FIG. 10 is a schematic of an equivalent diode model of a parallel module 620 illustrated in FIG. 11.

FIG. 13 shows a portion of a module 600. It should be appreciated that module 600 is the generic representation of either module 610 or 620. Acrylic superstrate 200 may have notches to save plastics. Concentrated light beams 601 impinge on a section of cell 100. The geometry between acrylic superstrate 200 and cell 100 is important so as to allow the maximum amount of radiant energy to focus at the focal line for each cell, i.e., superstrate 200 is a focusing lens. As may be seen, light beams 60 1 are focused to each cell 100. Though acrylic has been chosen, any optical material with proper optical characteristics may be used.

Figure 12:
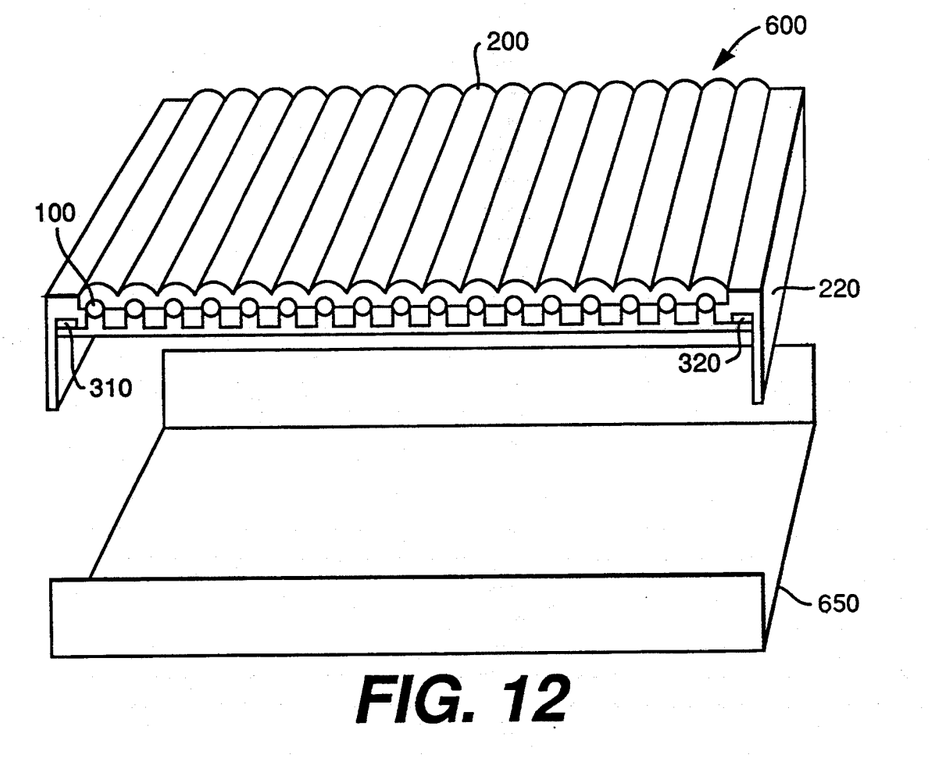
FIG. 12 is a perspective view of the module and frame assembly.

Module 600 is fitted with an aluminum frame 650, as shown in FIG. 12. This provides structural integrity to large sized modules. Although aluminum is the preferred metal, a number of other likely materials may be used such as alloys or other metals or plastics.

Turning now to the formation of cell 100 and module 600; substrate 10 measures 500 $\mu$m in diameter and is preferably formed of soda lime glass. The depositions of molybdenum 20, CIGS 30, CdS 40 and ZnO 50 are applied selectively while fiber 10 is spooled. If co-evaporating widths of 15 cm are used in a rotating system, shown in FIG. 17, a 40 cm diameter spool would hold 300 wraps or one 375m fiber cell. This constitutes approximately one module 600.

Superstrate 200 dimensions were calculated as 0.45 cm from top of superstrate 200 to the focal point within the cell 100. This provides a concentration ratio of 12:1. The lens shape was generated using software based on Snell's law and reflectance loss data compiled from OFTICAD analysis. Total plastic volume is approximately 4600 cm$^3$ resulting in a 4.5 kgm module weight. Center to center fiber separation is 0.4 cm and there are one hundred and fifty parallel cell fibers. One hundred parallel cell fibers are needed to yield a 60 cm width. Each cell 100 operates at 750 mv and the module generates an operating voltage of approximately 112 V. The power and current will be 144 W and 1.28 A, respectively. Module 600 has an over-all dimension of 60 cm$\times$240 cm. The superstrate optical power transmission is approximately between 78% and 91%. The fiber cell module costs approximately 50% less to manufacture than a similarly constructed monolithic cell module. Finally, each cell 100 has an efficiency approaching 10%.

Figure 14:
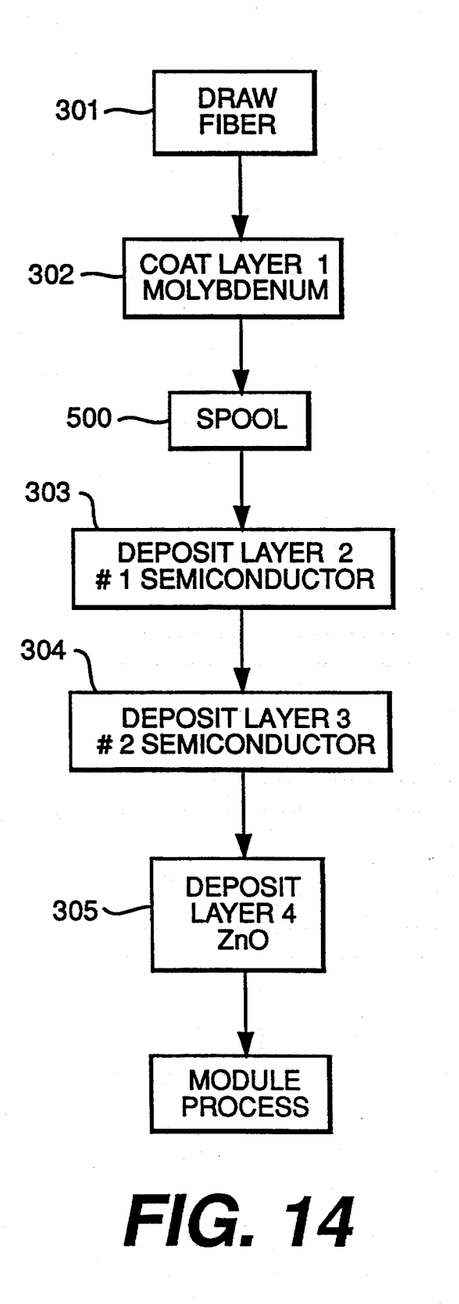
FIG. 14 is a block diagram showing the steps in the cell formation process.
Figure 15:
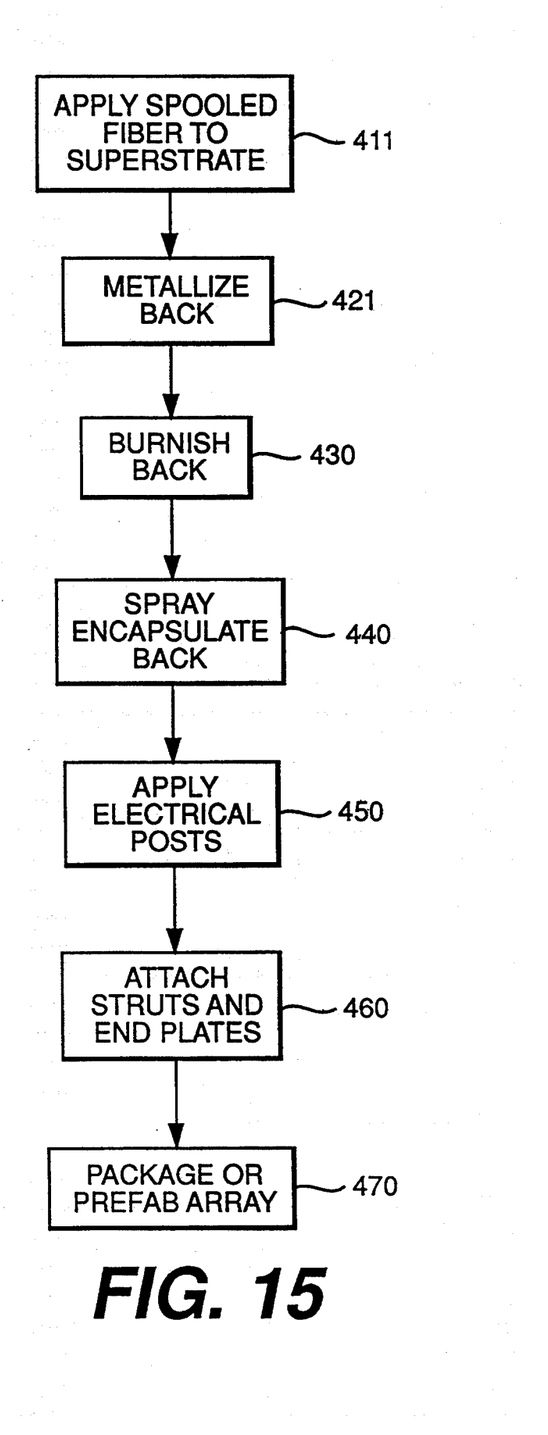
FIG. 15 is a block diagram showing the steps in the module formation process.
Figure 16:
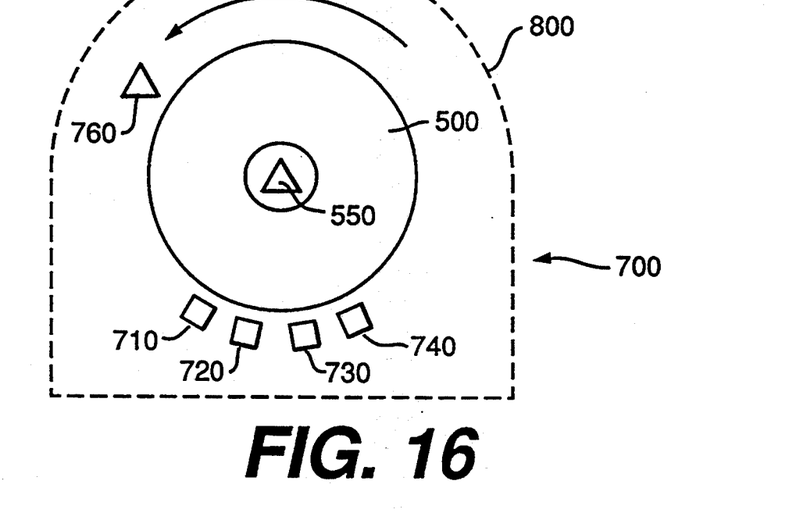
FIG. 16 is side view of a vapor deposition system.
Figure 17:
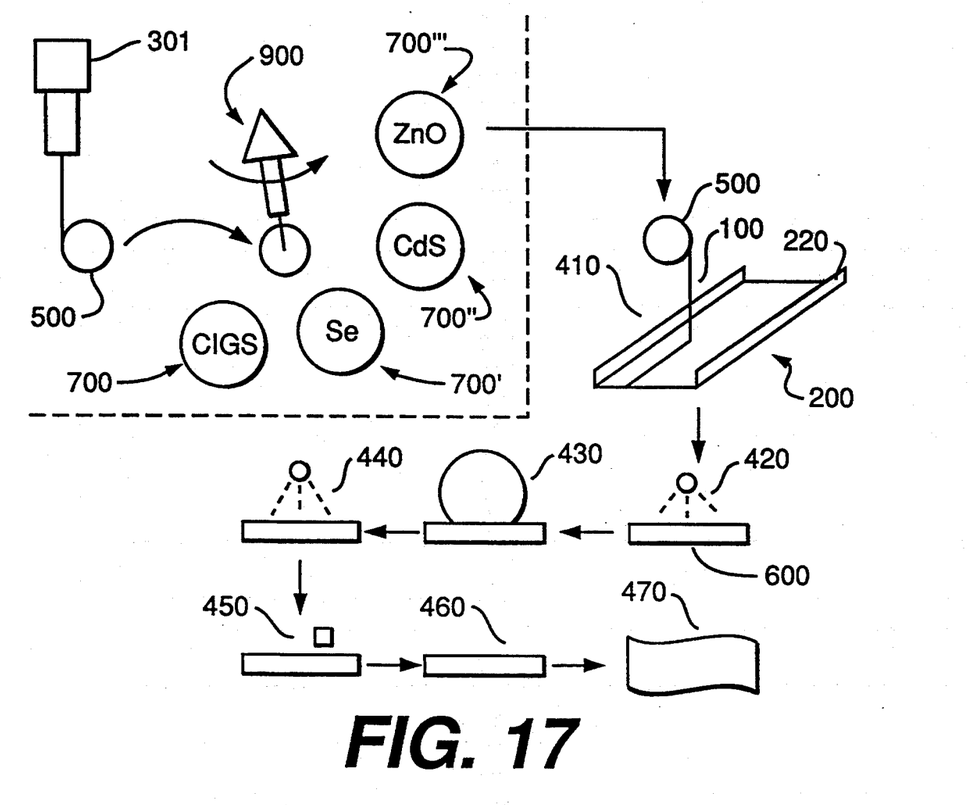
FIG. 17 is a diagrammatic view illustrating the steps in the process of manufacturing the solar cell and module.

Referring now to FIGS. 14 through 17, substrate 10 is drawn and coated with a first layer of conductive material. This step is illustrated by blocks 301 and 302. This coated fiber is then spooled into spool 500. Spool 500 is inserted into a vapor deposition chamber 700 with a bell jar 800 and monitoring system 760. A robotic arm 900, see FIG. 17, is used to move spool 500 from one vapor deposition chamber to the next. The monitor 760 is used to check the stoichiometry of each coating. At the center of spool 500 is a halogen spool heater 550. Deposition chamber 700 may consist of a single source or multiple sources 710, 720, 730 and 740. As shown in FIG. 16, the multiple sources may be Cu 710, In 720, Ga 730 and Se 740. There is provided a deposition chamber 700 for each material being deposited. These chambers are illustrated as 700', 700" and 700''' in FIG. 17. During deposition, spool 500 is rotated to allow for selective deposition. Spool 500 is placed into a vapor deposition chamber for selenization. Deposition continues with a first semiconductor material 30 and second semiconductor material 40. These depositions are performed within separate chambers. The final step in constructing cell 100 is to deposit ZnO by means of a deposition process. The deposition steps are illustrated in FIG. 14 as blocks 303 through 305.

First, spool 500 is cut into or striped and fiber cell strip sections 100 are heat pressed into the superstrate 200. This step is illustrated in FIG. 17 element 410 and in FIG. 15 as block 411. Cells 100 are rotated about their centers relative to superstrate 200, to provide access to both front and back contact layers 50 and 20. Superstrate 200 has formed within, bus strips 310 and 320. Further, superstrate 200 is formed with side supports 220. A metallization process 420 is used to coat the back of cell 100 and module 600. This step is illustrated by block 421 of FIG. 15. Metalization layer 300 is then selectively removed by means of burnishing or scoring, see block 430. Module 600 is then encapsulated with plastic, see block 440. Electrical posts are connected to the bus strips 310 and 320, see block 450. Optionally, aluminum supports 650 are added to gain structural integrity and mounting points, as shown in FIG. 12. This step is illustrated as block 460. The end product is then combined with other modules 600 to form arrays, see block 470.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor solar cell comprising:
    an elongated substrate having a curved surface coated with at least a first and second semiconductive layer;
    it first conductive layer disposed between said first semiconductive layer and said substrate; and
    it second conductive layer disposed on said second semiconductive layer;
    wherein said semiconductor layers are selectively disposed about said substrate so as to form arcuate segments about said elongated substrate.

2. The solar cell as recited in claim 1, wherein said substrate is cylindrical in shape.

3. The solar cell as recited in claim 1 wherein said first conductive layer is molybdenum.

4. The solar cell as recited in claim 1 wherein said first semiconductive layer is doped with a a first conductivity type dopant.

5. The solar cell as recited in claim 4 wherein said second semiconductive layer is doped with an opposite conductivity type dopant as that of said first semiconductive layer dopant.

6. The solar cell as recited in claim 1, wherein said second conductive layer is ZnO.

7. The semiconductor solar cell as recited in claim 1 wherein said first conductive layer has the shape of an arcuate segment.

8. The semiconductor solar cell as recited in claim 1 wherein said second conductive layer has the shape of an arcuate segment.

9. A semiconductor solar cell module comprising:
    an elongated substrate having a curved surface coated with at least a first and second semiconductive layer;
    a first conductive layer disposed between said first semiconductive layer and said substrate;
    a second conductive layer disposed on said second semiconductive layer;
    said substrate, said first and second semiconductive layers, and said first and second conductive layers forming a solar cell;
    said semiconductor layers being selectively disposed about said substrate so as to form arcuate segments about said elongated substrate;
    said semiconductive solar cell affixed to a superstrate;
    a metallization layer applied to said semiconductive solar cell and said superstrate;
    said metallization layer being selectively removed to provide conductive paths; and
    electrical pads connected to said conductive paths.

10. The solar cell module as recited in claim 9, wherein said substrate and superstrate are coated with a protective material.

11. The solar cell module as recited in claim 10, wherein said protective material has an antireflective surface.

12. The semiconductor solar cell module recited in claim 10 wherein said protective material increases light intensity on said solar cell.

13. The solar cell module as recited in claim 9, wherein said coated substrate and said superstrate are affixed to a frame.

14. The solar cell module as recited in claim 13, wherein said frame is aluminum.

15. The semiconductor solar cell module recited in claim 9 wherein said first conductive layer has the shape of an arcuate segment.

16. The semiconductor solar cell module recited in claim 9 wherein said metallization layer is selectively removed to provide series electrical connection between adjacent semiconductive solar cells.

17. The semiconductor solar cell module recited in claim 9, further comprising a coating for environmental protection of said solar cell.

18. The semiconductor solar cell module recited in claim 9 wherein said second conductive layer has the shape of an arcuate segment.

* * * * *